United States Patent [19]
Jones

[11] Patent Number: 4,682,176
[45] Date of Patent: Jul. 21, 1987

[54] ACTIVE MATCHING TRANSMIT/RECEIVE MODULE

[75] Inventor: Edward J. Jones, Rome, N.Y.

[73] Assignee: The United States of America as represented by the Secretary of the Air Force, Washington, D.C.

[21] Appl. No.: 838,970

[22] Filed: Mar. 12, 1986

[51] Int. Cl.$^4$ ............................................... G01S 7/02
[52] U.S. Cl. .................................. 342/175; 333/17 M; 333/32
[58] Field of Search ................. 333/17 M, 32; 342/42, 342/51, 157, 158, 175; 343/860–864

[56] References Cited

U.S. PATENT DOCUMENTS

| | | | |
|---|---|---|---|
| 3,270,346 | 8/1966 | Lerner | 343/777 |
| 3,794,941 | 2/1974 | Templin | 333/17 R |
| 3,906,405 | 9/1975 | Kommrusch | 333/17 M |
| 4,201,960 | 5/1980 | Skutta et al. | 333/17 M |
| 4,311,972 | 1/1982 | Landt et al. | 333/17 M |
| 4,351,060 | 9/1982 | Treiber | 375/12 |
| 4,486,722 | 12/1984 | Landt | 333/17 M |
| 4,502,025 | 2/1985 | Carl, Jr. et al. | 333/24 R |
| 4,502,027 | 2/1985 | Ayasli | 333/164 X |

Primary Examiner—Paul Gensler
Attorney, Agent, or Firm—William G. Auton; Donald J. Singer

[57] ABSTRACT

A transmit/receive module is disclosed that provides selectable impedance matching between: a power amplifier and the antenna of a phased array when the radar is transmitting, and selectable impedance matching between the antenna and a low noise amplifier when the radar is receiving. The transmit/receive module replaces the conventional fixed impedance matching system with a microprocessor, a plurality of switches and sets of pairs of electrical capacitors, resistors, and inductors. Since the antenna impedance characteristics change with changes of beam angles, the microprocessor directs the switches to configure the electrical components into any one of a number of impedance matching circuits. The microprocessor selects an optimum impedance matching circuit for the power amplifier to maintain maximum power transfer for radar transmission and another optimum impedance matching circuit for the low noise amplifier for minimum noise upon radar signal reception.

3 Claims, 7 Drawing Figures

MAXIMUM POWER TRANSFER $Z_o = Z_a^*$

MINIMUM NOISE $R_a = R_s$

ACTIVE MATCHING TRANSMIT/RECEIVE MODULE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to impedance matching circuits used in phased array radar systems and more particularly to a transmit/receive (T/R) module which provides adaptive matching to the output impedance of a radar system's power amplifier during transmisson, and also to the input impedance of the low noise amplifier (LNA) during signal reception.

Phased array radar systems steer their beams electronically, and are generally preferable to the older mechanically-steered parabolic antennas. However, for different beam conditions, the impedance match required during transmit and receive is known to vary, and is not a constant value.

For optimum performance, the array antenna should be impedance matched with its transmitter during transmission, and with its receiver during reception. Ideally, if the array is impedance matched with the transmitter, then there is no reflection by the array during transmission, and all of the transmitter power will be radiated. Similarly, during reception the array should be impedance matched with the receiver.

The general design principles of impedance matching can be stated even more specifically. For maximum power transfer during transmission, the output impedance of the power amplifier should be the complex conjugate of the load. For minimum noise during reception the low noise amplifier's reflection coefficient should be matched with the reflection coefficient of the antenna.

A variety of systems are currently used in the art to accomplish the impedance matching objectives cited above. Two principal systems are: the fixed output matching impedance system; and the ferrite circulator.

The fixed output matching impedance system, as the title suggests, contains two impedance matching circuits which provide fixed impedance matching to the LNA and to the power amplifier. The disadvantage of this fixed impedance matching system is that it is limited, and capable of only fixed impedance matching However, the advantages of this system includes low cost, low weight, and comparatively small size.

Ferrite circulators provide variable and selectable impedance matching for power amplifiers and low noise amplifiers, and are commonly used in phased array radar systems. The advantage of ferrite circulators is that they are capable of much better impedance matching than the fixed output matching impedance systems. However, ferrite circulators are costly, bulky, and weigh much more than the fixed output matching impedance systems.

The task of providing an impedance matching system which combines the flexibility of ferrite circulators with lower cost, lower weight, and less bulk, is alleviated, to some degree, by the following U.S. Patents, which are incorporated herein by reference:

U.S. Pat. No. 3,270,346 issued to Lerner;
U.S. Pat. No. 3,794,941 issued to Templin;
U.S. Pat. No. 4,311,972 issued to Landt et al;
U.S. Pat. No. 4,351,060 issued to Treiber; and
U.S. Pat. No. 4,502,025 issued to Carl, Jr. et al Lerner is pertinent for its disclosure of selective connecting circuits for impedance matching an array of antennas. The patent discloses the matching of an array antenna to both transmitters and receivers. Polarization selective means such as the combination of transmission line and electric probes are used to provide a matching effect which varies with excitation condition so as to provide closer impedance matching for a number of excitation conditions, thereby improvrng the performance of the array antenna.

Carl, Jr., et al disclose an antenna coupler which acts as a solid state transmit/receive or TR switch for selectively coupling the antenna to either a transmitter or receiver. Templin shows an automatic antenna tuner including digital control circuits for selecting reactive tuning elements of an antenna impedance matching network.

In Landt et al an antenna coupler samples the power transferred between the transmitter and the load in response to the samples connects a tuning stub to the transmission lines to ensure matched impedance conditions between the transmitter and the load. A recursive digital filter is disclosed in Treiber for automatically digitally synthesizing an output impedance which matches a line.

The above-cited references are exemplary in the art and provide effective impedance matching systems which may serve as substitutes for the overly complex and bulky ferrite circulator or the simplistic fixed output impedance matching system. However, the need remains to combine the simplicity and reduced weight of the fixed output impedance matching system with the increased flexibility of the more complicated ferrite circulators and similar substitutes. The present invention is intended to satisfy that need.

SUMMARY OF THE INVENTION

The present invention is a transmit/receive (T/R) module for a phased array radar that uses adaptive matching instead of a ferrite circulator in its output. The module uses an active control technique to maintain a good microwave match between the module's power amplifier output stage and the antenna element to provide maximum power transfer in the transmit mode. It also provides a very good microwave match between the antenna element and the input stage of the low noise amplifier to maintain a minimum noise figure for the module in the receive mode. The control function is incorporated within the module's microprocessor so that no additional circuitry is required. With this construction there is no need for a costly and bulky ferrite circulator.

The matching of the output impedance of the power amplifier with the complex conjugate of the load of the antenna elements requires flexibility because the antenna impedance changes with different beam steering conditions. The fixed output impedance matching system provides limited impedance matching using: an output inductor, an output capacitor, and a grounding capacitor. The output inductor and output capacitor are connected in series with the power amplifier and the load. The grounding capacitor connects a common electrical ground to the junction between the output capacitor and the output inductor. The values of these elements need not be discussed since this system is known in the art and are selected for a load presented by the particular antenna involved.

The present invention replaces the fixed output impedance matching system described above with five switches, two output inductors, two output capacitors, and two grounding capacitors. Each pair of inductors and capacitors is positioned in parallel and are connected by one of the five switches such that they provide alternatives to each other. The result is a circuit similar to the fixed output impedance matching system described above, with an important difference. The switches allow different output inductors, different output capacitors and different grounding capacitors to be selected for use, depending upon the different load requirements. In the embodiment described above, this results in nine different impedances that may be selected: eight are finite impedances from the different switch configurations plus one infinite impedance if the switches are set to an open circuit. These different impedances are controlled as described below.

The active matching T/R module of the present invention includes a microprocessor which automatically controls the switch configurations to provide impedance matching that is selected for different beam steering conditions. This control is as follows. As described above, eight different finite impedances are provided for the power amplifier depending upon the switch configurations. These eight known impedances are contained in a correlation table in the microprocessor. In a similar manner, eight input impedances are also known for the low noise amplifier (as will be discussed below).

When the array steers the beam to different angles, the antenna has different known impedances. The microprocessor uses this information in the following decision making process. When the array is steered, the microprocessor receives the beam steering angle and correlates this with the actual antenna impedance. Then, from the correlation table, the microprocessor selects one of the eight impedances that comes the closest to the actual impedance. Finally, the microprocessor directs the switches to close to assume the configuration indicated in the correlation table.

In a manner similar to that described above, active matching is provided for the low noise amplifier using: six switches, two grounding resistors, two input inductors, and two input capacitors. Each pair of resistors, capacitors, and inductors is in a parallel circuit and connected by a switch to provide eight different configurations similar to that of the fixed impedance matching systems. In combination with the microprocessor, this portion of the T/R module actively matches the LNA reflection coefficient with that of the antenna during reception for minimum noise.

It is an object of the present invention to match the output impedance of a radar system's power amplifier with the complex conjugate of the load of the antenna during transmission to maximize power transfer.

It is another object of the present invention to match the LNA reflection coefficient with that of the antenna during signal reception to minimize noise.

It is another object of the present invention to provide increased flexibility in impedance matching over that provided by fixed output impedance matching systems.

It is another object of the present invention to provide an impedance matching system with reduced bulk, weight, and complexity of that of ferrite circulator systems.

These objects together with other objects, features and advantages of the invention will become more readily apparent from the following detailed description when taken in conjunction with the accompanying drawings wherein like elements are given like reference numerals throughout.

DESCRIPTION OF THE DRAWINGS

FIG. 3b is a portion of the matching circuit of the present invention used with the power amplifier of FIG. 3a;

FIG. 4b is the active matching circuit of the present invention used with the low noise amplifier of FIG. 4a.

DETAILED DESCRIPTION OF THE PREFERRED EMBODIMENT

The Active Matching Transmit/Receive Module (AMTRM) is a self-contained phased array radar transmit/receive module that is capable of providing impedance matching between the array elements and the radar's power amplifier, during signal transmission, and with the low noise amplifier during signal reception. In the transmit mode, a microprocessor determines the optimum output impedance for the power amplifier and adjusts the invention accordingly in order to maintain maximum power transfer to the antenna as the antenna's beam is steered in space. In the receive mode the microprocessor determines the optimum input impedance for the low noise amplifier and adjusts the invention accordingly in order to maintain minimum noise figure for the T/R module-antenna configuration.

Figure 1:
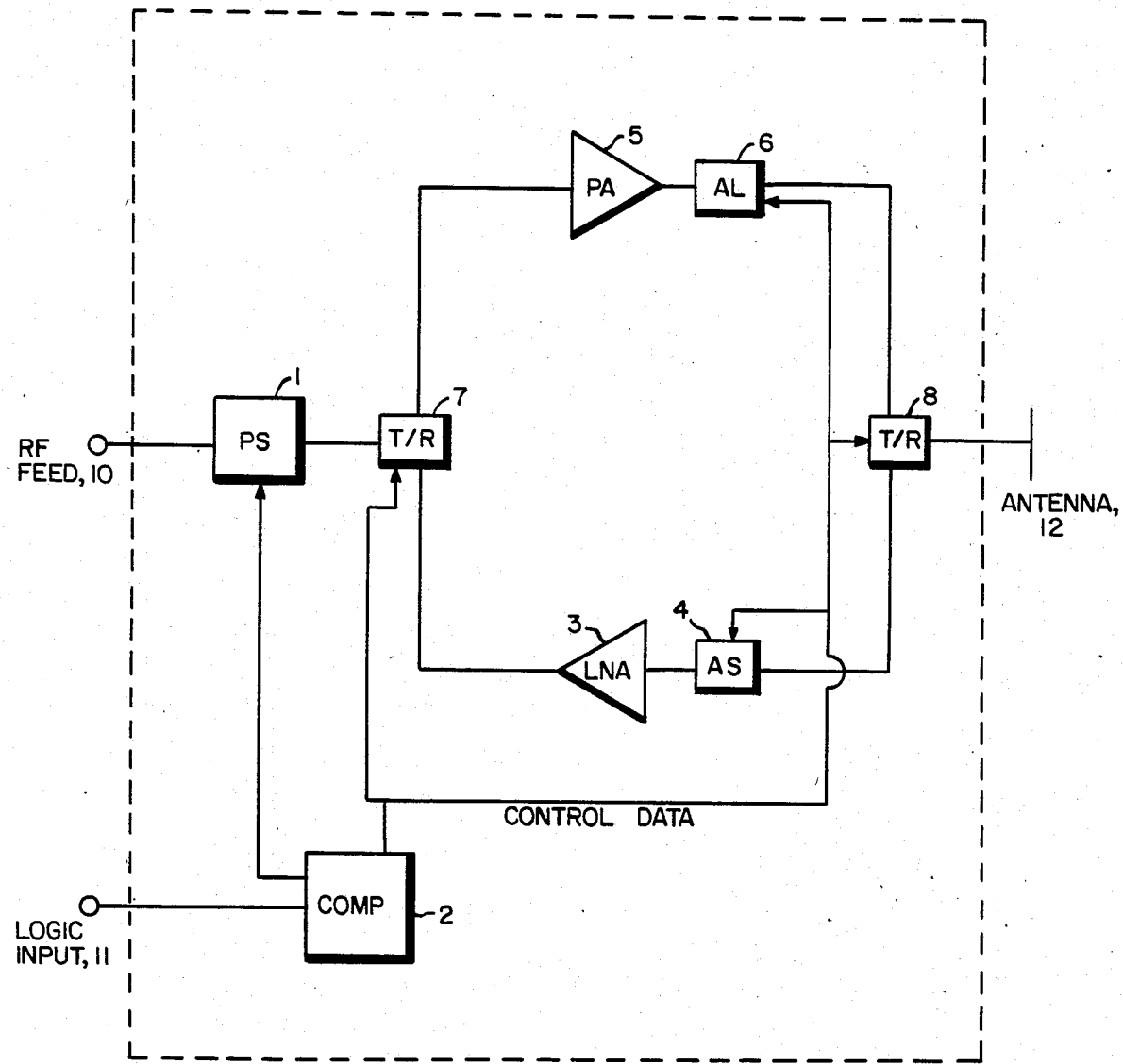
FIG. 1 is a block diagram depicting the use of the active matching T/R module.

The reader's attention is now directed towards FIG. 1, which is a block diagram of the Active Matching Transmit/Receive Module of the present invention. The AMTRM is made up of a multi-bit phase shifter 1 (PS), a microprocessor 2 (comp), a low noise amplifier 3 (LNA) with active source matching 4 (AS), a power amplifier 5 (PA) with active load matching 6 (AL), and two transmit/receive switches 7 and 8 (T/R). For the radar transmitter, a radio frequency (RF) feed 10 inputs a radio frequency signal to the phase shifter 1 which corresponds to the waveforms which are intended to be transmitted. From a radar's beam steering unit the logic input 11 provides the beam steering angle to the microprocessor 2 which relays it to the phase shifter 1 which electronically steer the beam by the phase of the signal. The two T/R switches 7 and 8 serve as a duplexer which connect and disconnect the LNA 3 and power amplifier 5, depending upon whether the radar is transmitting or receiving. The function of source matching 4 and load matching 6 are presented immediately below.

Figure 2A:
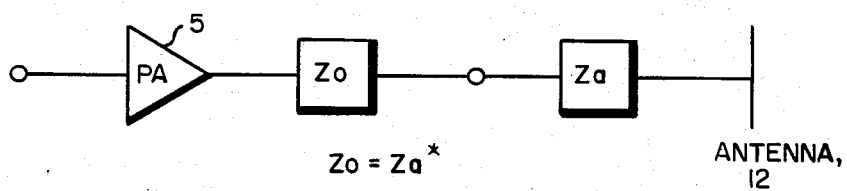
FIGS. 2a and 2b are block diagrams depicting the impedance matching requirements of a power amplifier and a low noise amplifier.
Figure 2B:
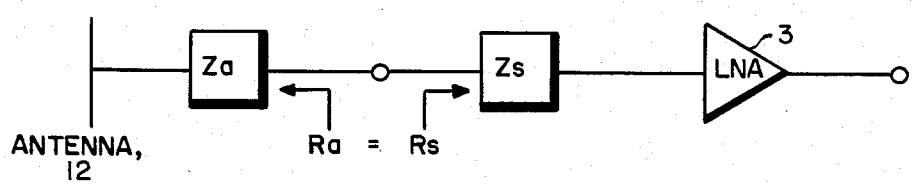

FIGS. 2a and 2b are block diagrams depicting the impedance matching requirements of the power amplifier 5 and low noise amplifier 3 of FIG. 1. Referring to FIG. 2a, the function of active load matching 6 in FIG. 1 is as follows. For maximum power transfer during radar transmission, the output impedance Zo of the power amplifier 5 must be equal to the complex conjugate impedance Za* of the load. The load during transmission is the impedance of the antenna 12.

Referring to FIG. 2b, the function of active source matching 4 in FIG. 1 is as follows. For minimum noise, the low noise amplifier's input matching network must transform the antenna's reflection coefficient (Ra) into the LNA's first stage reflection coefficient (Rs) while maintaining high amplifier gain.

Figure 3A:
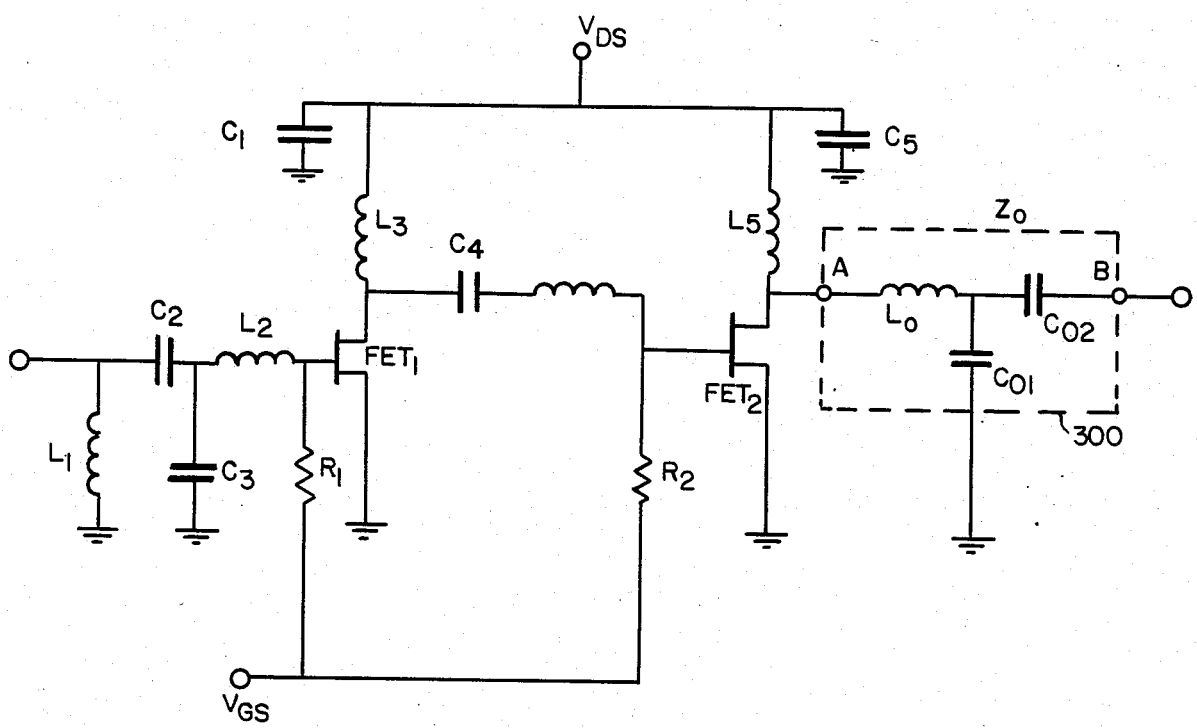
FIG. 3a is an electrical schematic of a power amplifier connected to a prior art fixed output impedance matching system.

FIG. 3a is a detailed electrical schematic of a general purpose power amplifier connected to a fixed output impedance matching system 300. The purpose of this prior art system 300 is to approximate the required fixed output matching impedance Zo shown in FIG. 2a. This task is difficult for this prior art system since the array impedance varies with different steering angles.

Figure 3B:
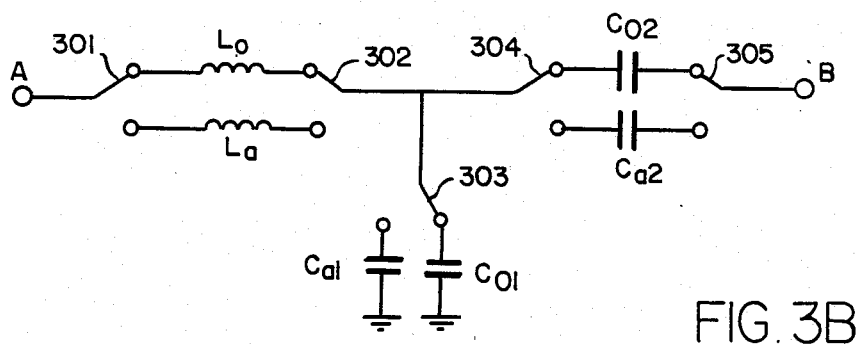

FIG. 3b depicts the active load matching circuit 6 of FIG. 1 which replaces the prior art system 300 of FIG. 3a. This active load matching circuit uses: five switches 301-305, two output inductors Lo and La, two grounding capacitors CO1 and Ca1, and two output capacitors C02 and Ca2. The different switch configurations result in eight different output impedances. These switches are controlled by the microprocessor 2 of FIG. 1. The microprocessor receives the commanded beam steering angle and correlates this with the actual antenna impedance that the array manifests at that beam steering position. The microprocessor next selects one of the impedances which xost closely compares to the actual antenna impedance of the antenna. Finally, the microprocessor 2 directs the switches 301-305 to open and close in a configuration which correlates with the selected impedance value.

Figure 4A:
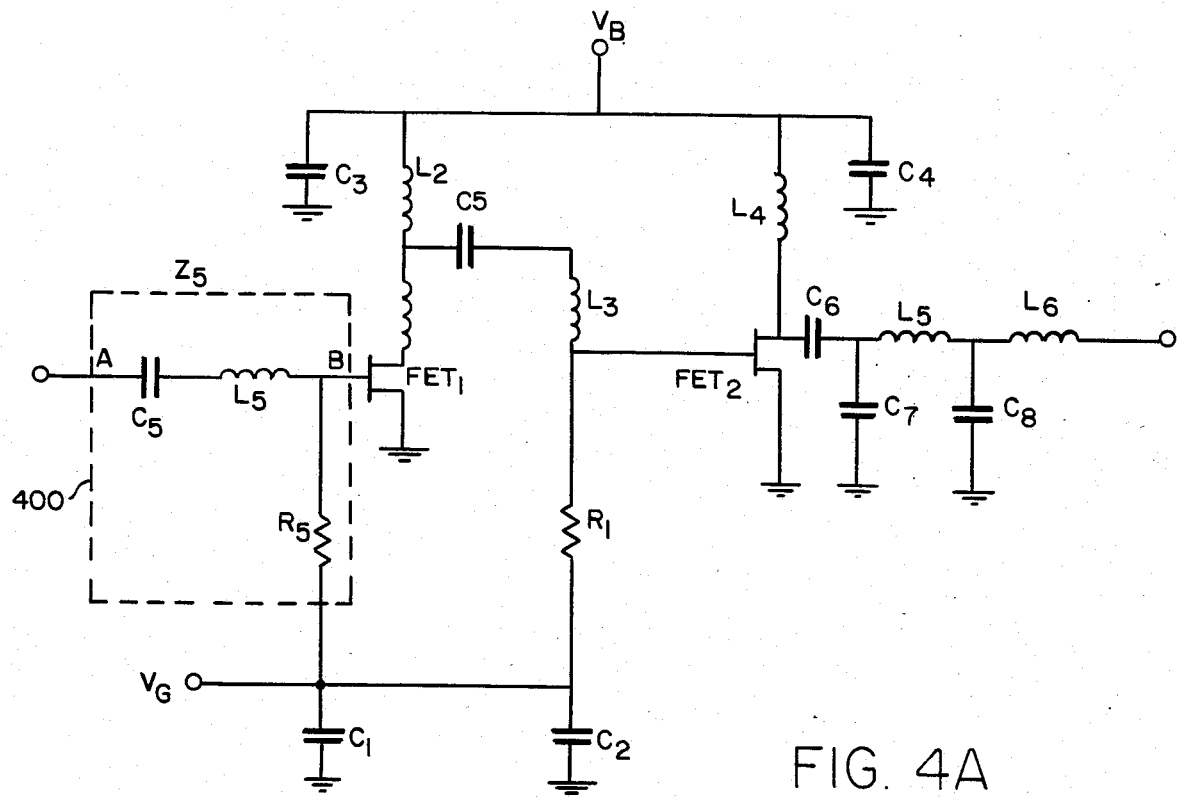
FIG. 4a is an electrical schematic of a low noise amplifier connected to a prior art fixed output impedance matching system.

FIG. 4a is a detailed electrical schematic of a general purpose low noise amplifier connected to a fixed source impedance matching system 400. The purpose of this prior art system 400 is to approximate an optimum input inpedance for the low noise amplifier. For minimum noise, the reflection coefficient of the LNA should match with that of the antenna. As mentioned above, this task is difficult for this prior art circuit 400 since the array impedance and reflection coefficient will vary with different beam angles.

Figure 4B:
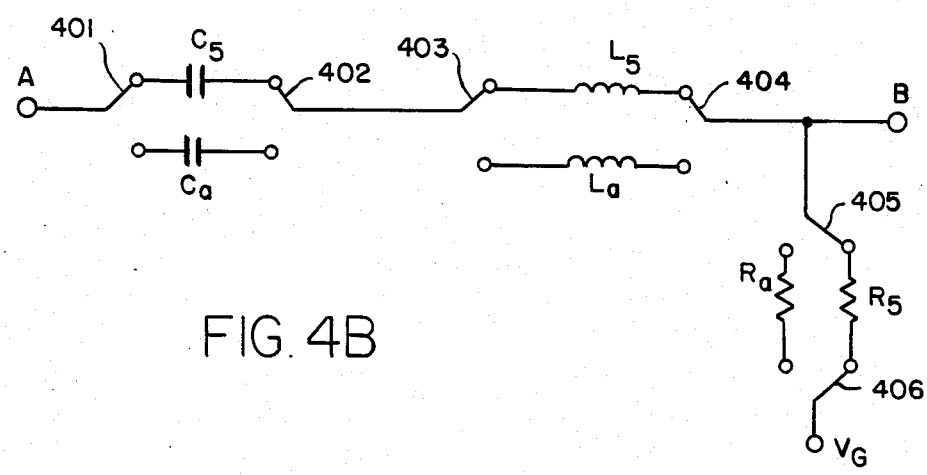

FIG. 4b depicts the active source matching circuit 4 of FIG. 1, which replaces the prior art system 400 of FIG. 4a. This active source matching circuit uses: six switches 401-406, two input capacitors C5 and Ca, two input inductors L5 and La, and two grounding resistors R5 and Ra. As with the figures above, the circuit values are not depicted since they may vary with the particular antenna being used. The different switch positions result in different configurations which result in different source impedance matches. These switches are controlled by the microprocessor 2 of FIG. 1 which correlates the switch positions with a correlation table of the resultant impedances. In the receive mode, the microprocessor determines the optimum input inpedance for the LNA and directs the switch configuration to produce the impedance which is closest to the desired impedance.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a phased array radar system having an antenna which transmits and receives radio frequency signals, a power ammplifier which provides said radio frequency signals to said antenna during transmission, and a low noise amplifier which receives said radio frequency signals from said antenna during reception, an active matching transmit/receive module comprising:

a control means which sends command signals during radar transmission to provide an optimum output impedance match for maximum power transfer, said control means also sending command signals to provide an optimum input impedance match between said low noise amplifier with said antenna;

an active load matching circuit which conducts said radio frequency signals from said power amplifier to said antenna, said active load matching circuit allowing a maximum power transfer during radar transmission by matching said power amplifier's output impedance so that it is approximately a complex conjugate of the antenn's load, said active load matching circuit including first and second output inductors, first and second grounding capacitors, each being connected with a common electrical ground, first and second output capacitors, and a first switching means which is electrically connected to said power amplifier and said antenna and conducts said radio frequency signals through a plurality of selectable output circuit configurations by making a first output selection between said first and second output inductors and connecting said first output selection to said power amplifier, said first switching means making a second output selection between said first and second grounding capacitors and connecting said second output selection to said first output selection, said first switching means making a third output selecton between said first and second output capacitors and connecting said third output selection in a series circuit between said first ouptput selection and said antenna, said first switching means being electrically connected to and receiving said command signals from said control means and making said first, second and third output selections in response thereto to produce variations of selectable output impedance for said power amplifier; and an active source matching circuit which conducts said radio frequency signals from said antenna to said low noise amplifier while providing selectable impedance matching between said low noise amplifier and said antenna, said selectable impedance matching comprising a plurality of impedance matching values from which may be selected an optimum input impedance match between the low noise amplifier and the antenna which results in a minimum of noise during signal reception, said active source matching circuit including first and second input resistors; first and second input inductors; first and second input capacitors; and a second switching means which is electrically connected to said antenna and said low noise amplifier and conducts said radio frequency signals through a plurality of selectable circuit configurations by making a first selection between said first and second input resistors and connecting said first selection to said antenna and a grounding voltage, said second switching means making a second selection be- tween said first and second input inductors and connecting said second selection to said antenna, said switching means making a third selection between said first and second input capacitors and connecting said third selection to said low noise amplifier and to said first and second selections, said switching means also being electrically connected to and receiving said command signals from said control means, and command signals directing said first, second and third selections, said second switching means thereby providing variations of selectable impedance matches, including said optimum input impedance match, between said low noise amplifier and said antenna.

2. An active transmit/receive module, as defined in claim 1, wherein said first switching means comprises:

a first switch electronically connected to said power amplifier and said control means, said first switch conducting said radio frequency signals from said power amplifier to said first output inductor, when so directed by said control signals from said control means, said first switch conducting said radio frequency signals to said second output inductor when so directed by said control signals from said control means;

a second switch which is electrically connected to said control means, said second switch connecting to and receiving said radio frequency signals from said first output inductor, when so directed by said control means, said second switch connecting to and receiving said radio frequency signals from said second output inductor when so directed by said control means;

a third switch which is connected to and receives said radio frequency signals from said second switch, said third switch also connected to said control means, said third switch conducting said radio frequency signals to said first grounding capacitor when so directed by said control means, said third switch conducting said radio frequency signals to said second grounding capacitor when so directed by said control means;

a fourth switch which is connected to and receives said radio frequency signals from said second switch, said fourth switch also connected to said control means, said fourth switch conducting said radio frequency signals to said first output capacitor when so directed by said control means, said fourth switch conducting said radio frequency signals to said second output capacitor when so directed by said control means; and a fifth switch which is electrically connected with and conducts said radio frequency signals to said antenna, said fifth switch being connected with said control means, said fifth switch connecting with and receiving said radio frequency signals from said first output capacitor when so directed by said control eans, said fifth switch connecting with and receiving said radio frequency signals from said second output capacitor when so directed by said control means.

3. An active transmit/receive module, as defined in claim 2, wherein said second switching means comprises:

a first input switch which is electrically connected to and receives said radio frequency signals from said antenna, said first input switch being connected to said control means, said first input switch connecting with said first input resistor when so directed by said control means, said first input switch connecting with said second input resistor when so directed by said control means;

a second input switch which is electrically connected to said grounding voltage and said control means, said second input switch connecting said first input resistor to said grounding voltage when so directed by said control means, said second input switch connecting said second input resistor to said grounding voltage when so directed by said control means;

a third input switch which is electrically connected to and receives said radio frequency signals from said antenna, said third input switch being connected to said control means, said third input switch connecting with and conducting said radio frequency signals to said first input inductor when so directed by said control means, said third input switch connecting with and conducting said radio frequency signals to said second input inductor when so directed by said control means;

a fourth input switch which is connected to said control means, said fourth input switch connecting with and receiving said radio frequency signals from said first input inductor when so directed by said control means, said fourth input switch connecting to and receiving said radio frequency signals from said second input inductor when so directed by said control means;

a fifth input switch which is connected to said fourth input switch and said control means, said fifth input switch connecting with and conducting said radio frequency signals to said first input capacitor when so directed by said control means, said fifth input switch connecting with and conducting said radio frequency signals to said second input capacitor when so directed by said control means; and a sixth input switch connected with and conducting said radio frequency signals to said low noise amplifier, said sixth input switch being connected with said control means, said sixth input switch connecting with and receiving said radio frequency signals from said first input capacitor when so directed by said control means, said sixth input switch connecting with and receiving said radio frequency signals from said second input capacitor when so directed by said control means.

* * * * *